United States Patent [19]

Lampert

[11] 4,448,634

[45] May 15, 1984

[54] PROCESS FOR POLISHING III-V-SEMICONDUCTOR SURFACES

[75] Inventor: Ingolf Lampert, Burghausen, Fed. Rep. of Germany

[73] Assignee: Wacker-Chemitronic Gesellschaft fur Elektronik-Grundstoffe mbH, Burghausen, Fed. Rep. of Germany

[21] Appl. No.: 513,813

[22] Filed: Jul. 15, 1983

[30] Foreign Application Priority Data

Oct. 7, 1982 [DE] Fed. Rep. of Germany ....... 3237235

[51] Int. Cl.³ .................... H01L 21/306; B44C 1/22; C03C 15/00; C03C 25/06
[52] U.S. Cl. .................................. 156/636; 156/662; 252/79.1
[58] Field of Search ...................... 156/636, 637, 662; 252/79.1, 79.5

[56] References Cited

U.S. PATENT DOCUMENTS 3,775,201 11/1973 Basi ..................................... 156/636
4,043,861 8/1977 Jacob et al. ......................... 156/636

OTHER PUBLICATIONS

IBM Technical Disclosure Bulletin, vol. 23, No. 7A, Dec. 1980, Semiconductor Polishing Composition, B. Holley et al., p. 2750.

Primary Examiner—William A. Powell
Attorney, Agent, or Firm—Collard, Roe & Galgano

[57] ABSTRACT

Surfaces of III-V-semiconductors, especially gallium phosphide surfaces, can be polished very successfully if, in the polishing operation, an alkali metal hypochlorite solution adjusted to a pH value of from 8.5 to 11 by the addition of buffering components, and a liquid containing in addition to the mechanical polishing component a complex-forming component, are applied to the surface to be polished.

6 Claims, No Drawings

PROCESS FOR POLISHING III-V-SEMICONDUCTOR SURFACES

The present invention relates to a process for polishing III-V-semiconductor surfaces, especially gallium phosphide surfaces. More particularly, it relates to such a process in which in the polishing operation a solution containing an alkali metal hypochlorite and a liquid containing a mechanical polishing component are applied to the surface to be polished.

With the increasing surface quality requirements, especially in the case of III-V-semiconductor wafers suitable for epitaxy, increased demands are also made on the processes by which these surfaces are polished. It is expected that such polishing processes should permit the production of flawless surfaces, especially without so-called fog, waviness or small pits, with simple handling and high abrasion rates. At the same time, low corrosive action of the polishing solutions should ensure the longest possible life span for the polishing apparatus. However, the processes currently used for polishing III-V-semiconductor surfaces, especially gallium phosphide surfaces, do not adequately meet these extraordinarily high demands.

For example, the alkali metal or alkaline earth metal hypobromite solutions used for polishing in accordance with DE-OS No. 22 52 045 are not suitable for broad industrial use if only because of their instability and high price. The process according to DE-OS No. 26 00 990, in which gallium phosphide surfaces are polished with a suspension of gallium hydroxide and/or aluminum hydroxide at a pH of 7.5 to 8 in the presence of an alkali metal hypochlorite, requires extremely accurate observation of the reaction conditions owing to the narrow pH range.

Polishing with sodium hypochlorite, sodium silicate and sodium zirconate, as proposed generally for semiconductor materials in DE-OS No. 24 54 802, gives good abrasion rates, per se, but produces a surface quality that is lacking. The same applies to the process according to U.S. Pat. No. 3,342,652 according to which gallium arsenide surfaces may be polished with aqueous solutions containing sodium hypochlorite and an alkali metal carbonate. In this case, too, acceptable abrasion rates can be achieved but only at the expense of the surface quality. Finally, there are known as polishing solutions, from DE-AS 15 46 063, mixtures of bromine and methanol; these have the disadvantage, however, of having a strong corrosive action on the polishing apparatus.

The object of the invention is therefore to provide a process for polishing III-V-semiconductor surfaces, especially gallium phosphide surfaces, that ensures ease of handling and a surface quality that meets high requirements without having the disadvantages relating to abrasion rates or corrosion.

This object is achieved according to the present invention by a process that is characterized in that the solution containing an alkali metal hypochlorite is adjusted to a pH value of from 8.5 to 11 by the addition of buffering components and that a complex-forming component is added to the liquid containing the mechanical polishing component.

Suitable mechanical polishing components are known to those skilled in the art. There come into consideration, for example, silicates or fluorosilicates, as described in DE-OS No. 17 52 163. Apart from these there may also be used, for example, quartz powder (cf. DE-AS No. 12 19 764), silica gels or sols (cf. U.S. Pat. No. 3,170,273) or aluminum or gallium hydroxide (cf. DE-OS No. 26 00 990). The mechanical polishing components selected in each case are applied to the polishing plate in the corresponding prescribed form, i.e., as a gel, sol or suspension of particles of suitable size.

In accordance with the invention, a complex-forming component is added to these liquids containing the mechanical polishing component. Especially suitable for this purpose are organic complex-forming agents that are adequately stable during the polishing operation with respect to the oxidizing agent hypochlorite contained in the second polishing solution and are not attacked, or are attacked only slightly. Such complex-forming agents are available, for example, advantageously in the form of oxalates, citrates or tartrates, especially those of alkali metals, such as sodium or potassium.

There is advantageously used as the solution containing an alkali metal hypochlorite, the solution available commercially under the name "bleaching lye" and obtained by the action of chlorine on sodium hydroxide solution. Also suitable are, for example, "Eau de Javelle", a solution obtained by the action of chlorine on potassium hydroxide solution, or solutions of, although less customary, lithium hypochlorite.

In accordance with the invention, the selected alkali metal hypochlorite-containing solution is adjusted to a pH value of from 8.5 to 11 by the addition of suitable buffering components. There come into consideration as buffering components, for example, hydrogen carbonates, such as, for example, sodium or potassium hydrogen carbonate, or hydrogen phosphates, such as sodium or potassium dihydrogen phosphate. Obviously, these buffering components are mentioned here only by way of example and shall in no way exclude the use of other buffer systems familiar to those skilled in the art and active in the said pH range.

In the customary arrangement of the polishing process according to the invention, the solution which contains an alkali metal hypochlorite in combination with the selected buffer system and the liquid which contains the mechanical polishing component in combination with the selected complex-forming agent, are made ready in separate supply vessels, and conveyed to the polishing machine by separate conduits, e.g., pipe systems with hose pumps. In the machine, they are combined directly during the polishing process on the polishing cloth and, as far as possible, an approximately equal supply rate thereof should be maintained. Suitable supply rates are generally approximately from 1 to 10 ml/min, relative to approximately 100 $cm^2$ of surface to be polished.

The buffered hypochlorite solution required for carrying out the process according to the invention is especially advantageously produced by diluting one part of commercially available bleaching lye (which usually contains about 180 g/l of NaOCl) with from 1 to 6 parts, preferably 3 or 4 parts, of water. By the addition of preferably solid sodium hydrogen carbonate (approximately from 20 to 50 g/l of solution), this solution is adjusted to a pH value of from 8.5 to 11, preferably from 9 to 10.5. The quantity added is selected so as to ensure that the suitable pH range is adhered to for the entire polishing operation.

The liquid that contains the mechanical polishing component is prepared, depending on the nature of the component used, in the manner disclosed in the relevant literature. The complex-forming component added in accordance with the invention, in solid or already dissolved form, is advantageously so added that a 1 to 10% by weight, preferably a 4 to 7% by weight, aqueous solution is obtained, if the proportion of mechanical polishing component is not taken into consideration.

By means of the process according to the invention, it is possible to obtain scratch-free and fog-free surfaces excellently suitable for epitaxy, especially in the case of gallium phosphide, both in the case of [111]- and [100]-orientation. The abrasion rates are approximately 45 µm/h. In the case of [100]-orientated gallium arsenide surfaces, even considerably high abrasion rates of up to about 160 µm/h can be achieved with very good surface quality.

The invention will now be described by several examples which are given by way of illustration and not of limitation.

EXAMPLE 1

In each case 25 monocrystalline gallium phosphide wafers (diameter 50 mm, thickness 420 µm, [100]-orientation) were glued with adhesive resin to aluminum support plates (diameter 340 mm). These support plates were then placed on the polishing plate, covered with a hard polishing cloth, of a customary commercial polishing machine, and polishing was carried out at a contact pressure of 8.0 N/cm² and at a polishing plate rotation of 70 rev/min, establishing a temperature of approximately 40° C. on the wafers. During the polishing operation, two polishing solutions (1200 ml of bleaching lye/3800 ml of water/160 g of sodium hydrogen carbonate, and 5000 ml of water/130 ml of silica sol/300 g of potassium-sodium tartrate) stored in separate supply vessels were conveyed separately to the polishing plate by hose pumps and, directly before flowing out onto the surface to be polished, combined in a ratio of approximately 1:1. The flow rate was approximately 90 ml/min; a pH value of 9.1 was obtained. The polishing operation produced an abrasion rate of approximately 45 µm/h. The gallium phosphide wafers obtained after 40 minutes' polishing (approximately 30 µm abrasion) had wave-free, fog-free and pit-free surfaces of excellent evenness.

EXAMPLE 2

The procedure was as described in Example 1, but gallium phosphide wafers with [111]-orientation were polished. The composition of the two polishing solutions was as follows: 1200 ml of bleaching lye/3800 ml of water/115 g of sodium dihydrogen phosphate; 5000 ml of water/150 ml of aqueous suspension of gallium hydroxide aged by heating for 2 hours at 80° C. (approximately 40 g solids content)/280 g of sodium citrate. The two solutions were each conveyed to the polishing plate at a flow rate of 45 ml/min and mixed there in a ratio of 1:1. The pH value was 9.4. With an abrasion rate of approximately 45 µm/h, after 40 minutes' polishing (abrasion approximately 30 µm), wave-free, fog-free and scratch-free [111]-gallium phosphide wafers were obtained.

EXAMPLE 3

Monocrystalline gallium arsenide wafers (diameter 50 mm, thickness 400 µm, [100]-orientation) were polished under the conditions described in Example 1. The abrasion rate achieved was 160 µm/h. The wafers obtained after polishing for 12 minutes (abrasion approximately 32 µm) were of very good surface quality.

While only several examples have been described, it will be obvious that many changes and modifications may be made thereunto, without departing from the spirit and scope of the invention.

What is claimed is:

1. In a process for polishing III-V semiconductor surfaces, in which, in the polishing operation, a solution containing an alkali metal hypochlorite and a liquid containing a mechanical polishing component are applied to the surface to be polished, the improvement comprising the steps of:
    adjusting the solution containing the alkali metal hypochlorite to a pH value of from 8.5 to 11 by the addition of buffering components; and
    adding a complex-forming component to the liquid containing the mechanical polishing component.

2. The process of claim 1, wherein said complex-forming component is selected from the group consisting of oxalates, citrates and tartrates and a combination thereof.

3. The process of claim 1, additionally including the step of applying said solution and said liquid to a gallium phosphide surface via a polishing cloth.

4. The process of claim 3, wherein said solution and said liquid are applied at approximately equal rates of from about 1 to 10 ml/min per about 100 cm² of surface to be polished.

5. The process of claim 1, wherein said solution comprises about 1 part bleaching lye and from about 1 to 6 parts water.

6. The process of claim 5, wherein said buffering components are selected from the group consisting of hydrogen carbonate, hydrogen phosphate and a combination thereof.

* * * * *